United States Patent
Neidhardt et al.

(10) Patent No.: US 6,490,993 B2
(45) Date of Patent: *Dec. 10, 2002

(54) ROTATING DEVICE FOR PLASMA IMMERSION SUPPORTED TREATMENT OF SUBSTRATES

(75) Inventors: Ronald Neidhardt, Stuttgart (DE); Jeanne Forget, Stuttgart (DE); Karl Kohlhof, Köln (DE); Siegmar Schoser, Wald (DE)

(73) Assignee: Robert Bosch GmbH, Stuttgart (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/341,763
(22) PCT Filed: Oct. 26, 1998
(86) PCT No.: PCT/DE98/03128
§ 371 (c)(1),
(2), (4) Date: Sep. 9, 1999
(87) PCT Pub. No.: WO99/25893
PCT Pub. Date: May 27, 1999

(65) Prior Publication Data
US 2001/0029896 A1 Oct. 18, 2001

(30) Foreign Application Priority Data
Nov. 17, 1997 (DE) .......................... 197 50 909

(51) Int. Cl.[7] ............................ C23C 16/509
(52) U.S. Cl. ............... 118/723 E; 156/345.43; 156/345.44
(58) Field of Search .................. 118/725, 563, 118/723 E; 361/600; 384/277; 204/298, 28

(56) References Cited

U.S. PATENT DOCUMENTS

| | | | |
|---|---|---|---|
| 3,936,704 A | * 2/1976 | Brenneman et al. | 361/600 |
| 4,118,624 A | 10/1978 | Luckan et al. | |
| 4,485,759 A | * 12/1984 | Brandolf | 118/503 |
| 4,764,394 A | 8/1988 | Conrad | |
| 5,064,522 A | * 11/1991 | Wellerdieck | 204/298.28 |
| 5,370,739 A | * 12/1994 | Foster et al. | 118/725 |
| 5,445,457 A | * 8/1995 | Schliephack | 384/277 |

FOREIGN PATENT DOCUMENTS

| | | |
|---|---|---|
| EP | 0 729 173 | 8/1996 |
| GB | 2 133 764 | 8/1984 |

* cited by examiner

Primary Examiner—Gregory Mills
Assistant Examiner—Rudy Zervigon
(74) Attorney, Agent, or Firm—Kenyon & Kenyon

(57) ABSTRACT

A rotary drive which is suitable in treatment of three-dimensional workpieces. In this rotary apparatus, only the removably mounted rotatable rods that serve as sample holders are connected to high voltage, which is delivered via a central high-voltage lead-in at the lower end of the rods, while the actual drive elements for rotating the rods are electrically insulated therefrom by suitable ceramic insulating elements.

11 Claims, 1 Drawing Sheet

ROTATING DEVICE FOR PLASMA IMMERSION SUPPORTED TREATMENT OF SUBSTRATES

FIELD OF THE INVENTION

The present invention relates to a rotary apparatus for plasma immersion-assisted treatment, in particular ion implantation treatment, of three-dimensionally shaped workpieces, of which at least one is immersed, within a vacuum chamber, at least temporarily into an ionized plasma while it is exposed to a periodically pulsed high voltage, so that the extracted ions not only react on the workpiece surface but are implanted beneath the workpiece surface; and a treatment method using this rotary apparatus.

BACKGROUND INFORMATION

In many industrial sectors today, surface properties of properties are already being deliberately modified by depositing or converting thin films under vacuum. Also known, in addition to deposition methods—which apply or deposit atoms or molecules onto a product surface from the gas phase, or by atomization or evaporation using a heating system, or by electron beam or arc—are non-deposition methods such as thermal and plasma treatment in inert or reactive gases, electron and laser treatments, or the implantation of inert, reactive, nonmetallic, or metallic ions into a substrate material.

Methods and apparatuses which combine an ion or plasma treatment with a coating operation are already known. These methods constitute the present standard for low-temperature deposition of high-melting-point alloy films which are used, for example, to protect mechanical components, e.g. highly stressed metal components, from wear, or to modify optical components, for example camera optics and spectacle lenses. Conversion of the applied ion energy into heat is utilized in this context. The ions are generated either in ion beam sources with or without mass separation, or in plasmas that either are excited in additional plasma sources with direct current, high-frequency currents or with microwaves, or are already present in any case in the context of plasma-assisted coating processes.

In the above described ion beam sources, ions are preaccelerated and directed onto one side of the workpieces to be treated. What is achieved thereby is a treatment or coating of substantially flat substrate surfaces. With the plasma technologies described above, however, negative DC electrical voltages are applied to the workpieces; these voltages can range from approx. 50 V to 1 kV, and with them the ions are directed, from all sides and in undirected fashion, not only onto substantially flat components but also onto the surface of three-dimensionally shaped components. At low ion energies (less than 1 keV), implantation effects such as doping, nonthermal alloying of nonequilibrium phases, interface mixing for adhesion enhancement, or accelerated diffusion via ion beam-induced structural defects are improbable and thus not industrially usable. For reasons of profitability, however, conventional ion-beam treatment (which is suitable for the purpose) is used in cost-sensitive production sectors (such as machine construction) only for specific and very limited product sectors.

A cost-effective plasma immersion-assisted ion implantation technology/has been developed by J. Conrad, J. L. Radke, R. A. Dodd, and F. J. Worzala and described in J. Applied Physics 62 (1987), p. 4591 (see also U.S. Pat. No. 4,764,394 issued to J. Conrad). In this so-called plasma immersion ion implantation method, also called PII, the workpieces are immersed, as with ion- or plasma-assisted coating, in a plasma. In contrast to the latter method, the magnitude of the applied negative voltage is from several kV to a few hundred kV, as a result of which the extracted ions not only react on the workpiece surface but are implanted beneath it, and initiate the aforementioned implantation effects. The high voltage is applied in the form of short pulses with a length of between several $\mu$s and several hundred $\mu$s, at a repetition frequency of between several hundred Hz and several kHz, in order to control heat input and at the same time minimize the complexity of the high voltage power supply. A further advantage of this pulsed technique is that buildup of the cathodic plasma edge layer along the workpiece contour, in which the voltage drop essential for ion acceleration occurs, is continuously being restarted. Immediately after the pulse start, an ion bombardment directed in perpendicular fashion onto the particular sample surface is thus always guaranteed, even in depressions or on elevations of structured geometries. Insufficient or raking ion bombardment, which occurs in unfavorable fashion in ion beam treatments, occurs with PII at the end of very long pulses when the plasma edge layer has expanded sufficiently far away from the plasma surface to create an enveloping plasma front that no longer follows the sample contour everywhere. This plasma edge layer propagates very quickly, e.g. within a few microseconds.

The PII processes that have hitherto been disclosed are used only for ion implantation, for example for nitriding steels or doping semiconductors. In this context, usually a separate plasma is generated by autonomous DC discharge or by high-frequency or microwave excitation, and the reactive components are usually admitted into it in gaseous form.

U.S. Pat. No. 4,764,394 also describes, for carrying out the PII treatment method, an apparatus that substantially has a high-vacuum treatment chamber with electrically conductive walls, for example made of stainless steel. All the conductive walls of this chamber are electrically connected to one another and to ground.

A three-dimensionally shaped workpiece is placed on an electrically conductive stationary pedestal spaced away from the chamber walls, and the conductive pedestal is joined to an electrically conductive support arm which holds the workpiece immovably and in electrical contact on the pedestal. The conductive support arm is electrically insulated from the conductive walls of the chamber by an insulator. High-voltage pulses are delivered to the workpiece from an external high-voltage pulse generator via a high-voltage line that is connected to the support arm and the pedestal.

When a high vacuum has been produced in the chamber, gas is admitted into the chamber to form a plasma that surrounds the workpiece (immersion). This gas is a mixed gas that contains the components necessary for implantation treatment. This neutral gas mixture within the chamber is ionized, for example, by a diffuse electron beam that proceeds from a heating coil inside the chamber.

U.S. Pat. No. 4,764,394 also mentions various other sources for the gas mixture needed for the PII treatment, e.g. by evaporation of liquids and solids. By way of magnet elements placed outside the chamber, there is generated inside the chamber a magnetic field that deflects the diffuse electrodes proceeding from the electron source away from the chamber walls and into the interior of the chamber, where they can collide with gas atoms or molecules and ionize the gas.

The above US Patent mentions neither a coating treatment of workpieces nor the use of a large-area coating plasma as an immersion plasma. In addition, the apparatus described in this US Patent does not provide for rotation of the workpiece being treated within the reaction chamber.

Since it is necessary, in the case of the aforementioned plasma immersion-assisted treatments, for high-voltage pulses of up to 100 kV to be delivered to the workpiece or workpieces within the high-vacuum treatment chamber, movement o f the workpiece by way of a rotary drive is possible only with special designs. This is complicated, among other factors, by the risk of high-voltage flashovers; there is a risk in particular of linear creepage sparks, i.e. discharges along regions in which metal, insulating ceramic, and plasma meet one another. In addition, reliable contact must be made to the moving parts, since only durable planar contacts make possible nonsparking delivery of voltage or current.

The basic idea of plasma immersion-assisted ion implantation is that a workpiece is immersed in a plasma and then, by application of a pulsed high voltage, experiences homogeneous treatment on all sides by ion implantation. The use of a magnetron sputtered plasma as the immersion plasma allows this ion implantation method to be combined with coating techniques.

Plasma sources, but principally coating plasma sources, often have a certain directional characteristic. In order to obtain homogeneous, uniform treatment of the workpiece even in this situation, it must be moved during the process. In known coating methods, this is achieved by way of a rotary drive. Because of the pulsed high voltage that is applied to the workpieces in the PII method, however, this has hitherto not been possible for that PII process.

SUMMARY OF THE INVENTION

In view of the above, one object of the present invention is to provide a rotary drive for plasma immersion-assisted treatment of workpieces such that with it, ion implantation operations and ion-assisted low-temperature coating operations can be performed economically, with high adhesion and structural quality, even on three-dimensionally structured workpieces of complex geometry; such that multiple workpieces can be rotated; and such that economical, homogeneous, and temperature-stable coating using the PII treatment method is achieved without the risk of high-voltage flashovers, linear creepage sparking, or poor high-voltage delivery.

An apparatus achieving the above-described object for rotating at least one workpiece, in particular for performing a plasma immersion-assisted treatment includes, among other things.

- at least one rotatably driven sample holder in the form of a rotatably mounted, electrically conductive sample rod;
- a rotary drive that engages on each sample rod in order to rotate it;
- a high-voltage lead-in that delivers high voltage to the sample rod; and
- at least first insulating means which insulate the sample rod (11) from the rotary drive in a manner withstanding high voltage.

The fundamental idea of the design of the rotary drive according to the present invention is that the entire apparatus is not at high-voltage potential, but rather that the actual driving and moving parts are at low-voltage potential, e.g. grounded, in a floating or defined state at up to the 1000 volt level. The insulating means (e.g., an arrangement) which are provided between the sample rods and the other driving and moving parts, and whose dimensions depend on the maximum voltage, electrically separate the sample rods, which serve to attach the workpieces, from the other parts of the apparatus. Contacting and delivery of high voltage to the sample rod or rods is accomplished at the other end thereof via planar wiper contacts.

Described below is an embodiment of the rotary drive usable for plasma immersion-assisted treatment in particular of three-dimensional workpieces, and exemplary embodiments of the method according to the present invention.

BRIEF DESCRIPTION OF THE DRAWINGS

FIG. 2 shows a schematic illustration, partially in section, of a ceramic insulating element that is arranged at a lower end of each sample rod and serves simultaneously as pivot bearing and high-voltage lead-in.

DETAILED DESCRIPTION

Figure 1:
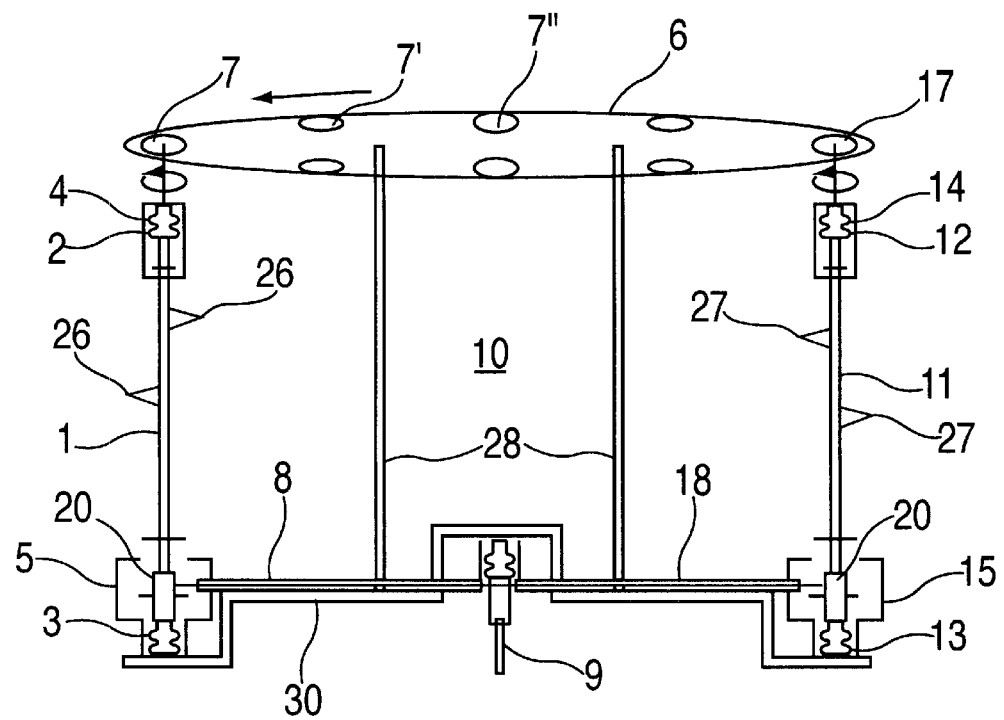
FIG. 1 shows an exemplary embodiment of a rotary drive which is suitable for performing a plasma immersion-assisted treatment in particular of three-dimensional workpieces.

In the case of the rotary drive shown in FIG. 1 and labeled generally with the number 10, the power transfer for rotation takes place at a point different from the high-voltage contact, and the entire arrangement is not at high-voltage potential, but rather only rods 1, 11 serving as sample holders, of which only two are shown in FIG. 1, by way of example in a parallel vertical arrangement. Instead of a vertical position, the sample rods can, for example, also be provided in a horizontal position. The actual driving and moving parts, on the other hand, are at low-voltage potential, e.g. grounded, in floating fashion or at a defined voltage level of up to 1000 V. Located for insulation at the upper end of sample rods 1, 11, are ceramic insulation elements 2, 12 serving as first insulating means, (e.g., an arrangement) whose geometrical dimensions depend on the maximum high voltage delivered to sample rods 1, 11. The rotary drive which engages at the upper 10 end of sample rods 1, 11 and rotates them, indicated by drive wheels depicted schematically as circles 7, 7', 7", 17, is thus insulated by ceramic insulation elements 2, 12 with respect to sample rods 1, 11 that carry the high voltage. Drive wheels 7, 7', 7", 17 in turn are mounted on a separately rotatable driven turntable 6, and can be, for example, frictionally driven disks or preferably pinions driven together in positive and nonpositive fashion by a linkage.

Ceramic insulation elements 2, 12, located at the upper end of sample rods 1, 11 that are mounted therein centrally, vertically, and removably, are rotated along with sample rods 1, 11. They are additionally protected, by metal cups 4, 14 of suitable shape, from deposition or plasma coating.

In order for the coating plasma to be usable in the rotary drive according to the present invention while the high-voltage pulses are simultaneously being delivered, these shielding panels and covers, configured as metal cups, serve to protect the insulating ceramic elements from metallic (conductive) coating. These sheet-metal cups are implemented essentially for use in coating plasmas, but can be implemented in many different geometrical fashions. Another result of such shields is that the plasma cannot reach all the parts that carry high voltage and result in unnecessary currents through the rotary drive, which would cause a current load on the pulse generator and heating of the rotary drive. It is important to note, with respect to the shielding, that the maximum voltage that can be applied depends principally on the spacings between parts that carry high voltage and other parts that do not carry high voltage. In vacuum or at a working pressure of 0.01–1 Pa, spacings of 10 mm are generally sufficient for voltages well above 30 kV.

The sample rods are locked in the upper ceramic insulating elements 2, 12 by way of bayonet fasteners (not shown). Clamps 26 and 27 are indicated schematically on sample rods 1, 11 for at retaining the workpieces or samples.

The sample rods 1, 11 are insulated at their lower end, again by ceramic insulation elements 3, 13, with respect to a base 30 that rotates in platform fashion along with turntable 6. These lower ceramic insulation elements 3, 13 are also protected against deposition and coating plasma by suitably shaped metal cups 5, 15.

FIG. 1 shows a central high-voltage lead-in 9 that is guided via branches 8, 18 to the foot of sample rods 26, 27. Also shown in FIG. 1 are support columns 28 which brace the entire rotary drive away from rotatable platform 30.

Figure 2:
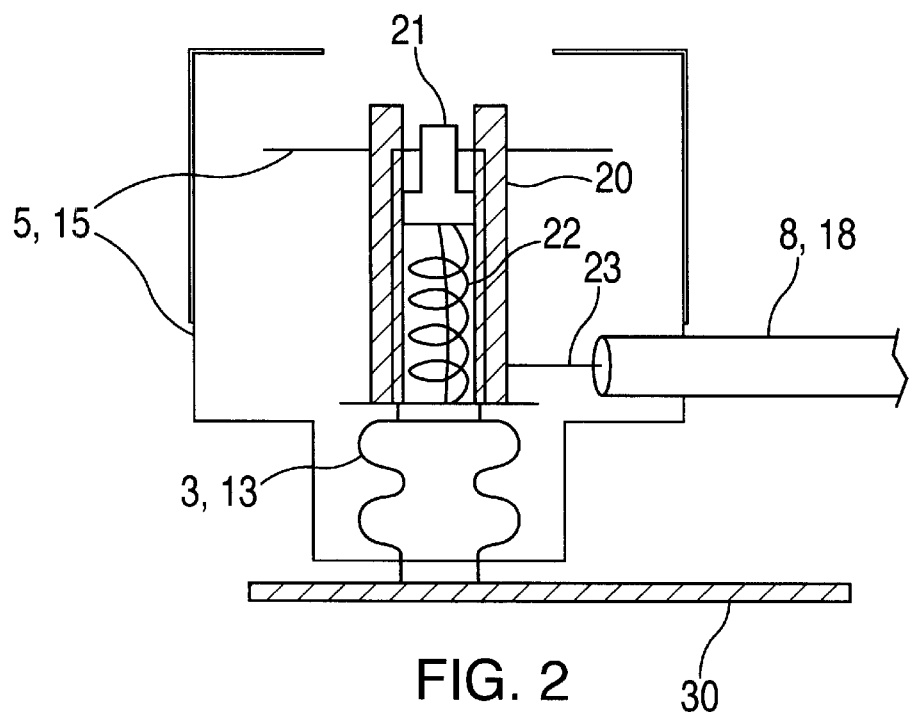

FIG. 2 shows, in detail and in enlarged fashion, the combined high-voltage lead-ins and bearings, arranged at the lower end of sample rods 1, 11, that are respectively attached to lower ceramic insulation elements 3 and 13. For this purpose, a metal bushing 20, preferably made of brass or alternatively from another highly conductive material, is attached centrally to ceramic insulation element 3, 13, forming the pivot bearing for the respective sample rod 1, 11 which can rotate therein in low-friction fashion. A graphite wiper contact pin 21, to which high voltage is conveyed via high-voltage lead-in branches 8, 18 and 23 and which is longitudinally movable in the brass bushing and preloaded by a helical spring 22, rests against the lower end surface of sample rods 1, 11. This type of high-voltage contact is similar to the central voltage lead-in in an ignition distributor in automotive electrical systems. Here as well, voltage pulses of up to a few tens of kV are delivered to the distributor via a graphite wiper contact.

In the case of the arrangement shown in FIG. 2, the lower end surfaces of sample rods 1, 11 rest in planar fashion against graphite pin 21. Brass bushing 20 is connected in its lower part, by a simple copper wire, to high-voltage line 23 that is shielded and guided in insulated fashion in a ceramic or metal tube 8, 18.

Much of the rotary drive, with retainers attached thereto, is at ground or floating potential, and that only the eccentrically mounted sample rods 1, 11 insulated therefrom in a manner withstanding high voltage, along with attachment elements 26 and 27, are connected to high voltage.

The rotary drive according to the present invention has two motors (not shown) outside the vacuum chamber, which drive a planetary gear drive in the vacuum chamber via suitable vacuum rotary unions (also not shown). Two rotary movements are performed thereby: turntable 6, together with platform 30 (rotatably connected via support columns 28) and sample rods 1, 11, performs a rotary movement about a vertical rotation axis (not shown); and sample rods 1, 11 individually rotate. Although only two sample rods 1, 11 are shown in FIG. 1 by way of example, any desired number, e.g. eight, sample rods arranged in a circle can be provided by appropriate design of turntable 6 and drive pinions 7, 7', 7'', 17.

With the exemplary embodiment of a rotary drive described above with reference to FIGS. 1 and 2 in order to perform a plasma immersion-assisted treatment, many workpieces can be moved in such a way as to permit economical, homogeneous, and temperature-stable coating. Plasma immersion processes have hitherto been performed with stationary workpieces (see U.S. Pat. No. 4,764,394), which is possible with nitriding and CVD processes. In PVD processes using plasma sources with directional characteristics, homogeneous treatment is possible only if the workpieces are moved uniformly. By moving the parts into and out of the plasma, the rotary drive according to the present invention makes possible temperature stabilization in the process.

Three further exemplary embodiments of plasma immersion-assisted substrate treatments which advantageously use the above-described rotary drive are described below:

I.

Use of a coating plasma as an immersion plasma for ion implantation:

Plasma of plasma-assisted coating methods from gas phases (CVD) generated by autonomous DC discharge;

Plasma of plasma-assisted coating methods from gas phases (CVD) generated by high-frequency or microwave excitation;

Gas mixtures comprising inert gases (e.g. argon), reactive gases (e.g. nitrogen, hydrocarbons, oxygen, compounds of fluorine, boron, or chlorine) and film-forming monomers Ad (silicon compounds, hydrocarbons, metalorganics);

Plasma of plasma- or ion-assisted coating methods from solids (PVD), such as unbalanced magnetron sputtering and arc evaporation, generated by DC voltage;

ditto, generated by high-frequency discharge;

Gas mixtures comprising inert gases (e.g. argon), reactive gases (e.g. nitrogen, hydrocarbons, oxygen, compounds of fluorine, boron, silicon, or chlorine);

Plasma of combined plasma-assisted CVD/PVD processes;

Application of positive or negative high-voltage pulses, depending on the material of the workpiece being treated; voltage level 1 kV–100 kV; high-voltage pulses of variable length and frequency.

II.

Ion assistance in coating methods by immersion of the workpieces in the coating plasma and application to the workpieces of negative high-voltage pulses from 1 kV to 100 kV and variable length and frequency.

Coating and ion treatment alternately;

Coating and ion treatment simultaneously;

Combination of coating operations without ion assistance and operations with plasma immersion ion treatment, alternately or simultaneously.

A number of materials can be treated with the aforementioned methods I and II according to the present invention:

Metals and metal alloys with negative high-voltage pulses;

Insulators and plastics with bipolar voltage pulses of various voltage levels for ion bombardments (e.g. −1 kv to −100 kV) and for removal of the positive charge applied thereby (e.g. +0 kV to +1 kV).

III.

Implementation of combined PVD/PII methods by applying bipolar voltage pulses to the workpieces at various negative and positive levels:

Arc evaporation or atomization of the surrounding cathodically connected electrode surface along the unit wall occurs during positive pulses (e.g. +0 kV to +1 kV);

Plasma immersion ion treatment occurs during negative pulses (e.g. −1 kV to −100 kV).

What is claimed is:

1. An apparatus for rotating at least one workpiece, comprising:
    a platform;
    at least one electrically conductive, rotatably driven sample rod having an upper end and a lower end;
    a rotary drive engaging with the upper end of the at least one rod to rotate the at least one rod;
    a pivot bearing;
    at least one high-voltage lead-in line contacting the lower end of the at least one rod for delivering a high voltage to the lower end of the at least one rod via the pivot bearing; and
    a first insulating arrangement insulating the at least one rod from the rotary drive so as to withstand the high voltage;
    a second insulating arrangement insulating the pivot bearing from the platform so as to withstand the high voltage; and
    an attachment element configured to hold the at least one workpiece arranged on the sample rod between the first insulating arrangement and the second insulating arrangement.

2. The apparatus according to claim 1, wherein the rotary drive engages with a first end of the at least one rod via the first insulating arrangement.

3. The apparatus according to claim 2, wherein the first insulating arrangement includes a ceramic insulator which is attached to the at least one rod in an insulating and centered manner, and wherein the ceramic insulator rotates with the at least one rod.

4. An apparatus for rotating at least one workpiece, comprising:
    at least one electrically conductive, rotatably driven sample rod
    a rotary drive engaging with the at least one rod to rotate the at least one rod;
    at least one high-voltage lead-in line delivering a high voltage to the at least one rod;
    at least one first insulating arrangement insulating the at least one rod from the rotary drive so as to withstand the high voltage:
    a platform;
    at least one second insulating arrangement ; and
    a pivot bearing delivering a potential of the high voltage to the at least one rod,
    wherein the rotary drive engages with a first end of the at least one rod via the at least one first insulating arrangement,
    wherein the at least one rod has a second end which is mounted in the pivot bearing, and
    wherein the at least one rod is insulated from the high voltage by the at least one second insulating arrangement with respect to the platform for withstanding the high voltage.

5. The apparatus according to claim 4,
    wherein the at least one rod is vertically mounted between the at least one first insulating arrangement and the at least one second insulating arrangement, and
    wherein the at least one first insulating arrangement is provided at a top portion of the at least one rod, and the at least one second insulating arrangement is provided at a bottom portion of the at least one rod.

6. The apparatus according to claim 4, wherein the at least one second insulating arrangement includes a ceramic support insulator which is attached to the platform, and the pivot bearing includes a metal bushing arranged on a center portion of the at least one second insulting arrangement, the at least one rod being capable of rotating in the metal bushing.

7. The apparatus according to claim 6, further comprising:
    a wiper contact coupled to the metal bushing for producing a planar high-voltage contact for the at least one rod.

8. The apparatus according to claim 7, wherein the wiper contact includes a graphite pin resting against an end surface of the at least one rod.

9. The apparatus according to claim 4,
    wherein the at least one rod includes a plurality of parallel rods for receiving a plurality of the at least one workpiece,
    wherein the rotary drive has two drive motors and power transfer systems,
    wherein the parallel rods are rotatable with the platform, and
    wherein at least one of the parallel rods or all of the parallel rods are rotatable.

10. The apparatus according to claim 3, further comprising:
    a metal shielding cup insulated from the at least one rod; and
    a metal cover insulated from the at least one rod,
    wherein the ceramic insulator is protected against a coating in a plasma using the metal shielding cups and the metal covers.

11. The apparatus according to claim 1, wherein the at least one workpiece is rotated for performing a plasma immersion-assisted treatment.

* * * * *

UNITED STATES PATENT AND TRADEMARK OFFICE
CERTIFICATE OF CORRECTION

PATENT NO. : 6,490,993 B2  Page 1 of 1
DATED : December 10, 2002
INVENTOR(S) : Ronald Neidhardt et al.

It is certified that error appears in the above-identified patent and that said Letters Patent is hereby corrected as shown below:

<u>Title page,</u>
Item [57], ABSTRACT,
Line 1, change "suitable in treatment" to -- suitable in particular for performing a plasma-assisted treatment --

Signed and Sealed this

Ninth Day of March, 2004

JON W. DUDAS
*Acting Director of the United States Patent and Trademark Office*